(12) United States Patent
Yuan et al.

(10) Patent No.: US 8,860,185 B2
(45) Date of Patent: Oct. 14, 2014

(54) CRACK-ARRESTING STRUCTURE FOR THROUGH-SILICON VIAS

(75) Inventors: Shaoning Yuan, Singapore (SG); Yue Kang Lu, Singapore (SG); Yeow Kheng Lim, Singapore (SG); Juan Boon Tan, Singapore (SG)

(73) Assignee: GLOBALFOUNDRIES Singapore Pte Ltd, Singapore (SG)

( * ) Notice: Subject to any disclaimer, the term of this patent is extended or adjusted under 35 U.S.C. 154(b) by 310 days.

(21) Appl. No.: 13/357,960

(22) Filed: Jan. 25, 2012

(65) Prior Publication Data

US 2013/0187280 A1  Jul. 25, 2013

(51) Int. Cl.
*H01L 23/544* (2006.01)

(52) U.S. Cl.
USPC .......................................... 257/620; 438/113

(58) Field of Classification Search
CPC ............................. H01L 23/562; H01L 23/564
USPC .......................................... 257/620; 438/113
See application file for complete search history.

(56) References Cited

U.S. PATENT DOCUMENTS

| | | | | |
|---|---|---|---|---|
| 8,193,039 B2 * | 6/2012 | Su et al. | .......... | 438/113 |
| 8,309,435 B2 * | 11/2012 | Kaltalioglu et al. | .......... | 438/462 |
| 8,338,961 B2 * | 12/2012 | Su et al. | .......... | 257/774 |
| 8,395,241 B2 * | 3/2013 | Yang et al. | .......... | 257/620 |
| 8,610,238 B2 * | 12/2013 | Kaltalioglu et al. | .......... | 257/508 |
| 2005/0026397 A1 * | 2/2005 | Daubenspeck et al. | ....... | 438/465 |
| 2008/0099884 A1 * | 5/2008 | Inohara | .......... | 257/620 |
| 2009/0321890 A1 * | 12/2009 | Jeng et al. | .......... | 257/620 |
| 2010/0109128 A1 * | 5/2010 | West et al. | .......... | 257/620 |
| 2010/0127937 A1 | 5/2010 | Chandrasekaran et al. | | |
| 2010/0207237 A1 | 8/2010 | Yao et al. | | |
| 2011/0193197 A1 | 8/2011 | Farooq et al. | | |

* cited by examiner

*Primary Examiner* — Nicholas Tobergte
(74) *Attorney, Agent, or Firm* — Amerson Law Firm, PLLC

(57) ABSTRACT

The subject matter disclosed herein relates to structures formed on semiconductor chips that are used for at least partially addressing the thermally induced stresses and metallization system cracking problems in a semiconductor chip that may be caused by the presence of through-silicon vias (TSV's), and which may be due primarily to the significant differences in thermal expansion between the materials of the TSV's and the semiconductor-based materials that generally make up the remainder of the semiconductor chip. One device disclosed herein includes a substrate and a crack-arresting structure positioned above the substrate, the crack-arresting structure comprising a plurality of crack-arresting elements and having a perimeter when viewed from above. The device also includes a conductive structure positioned at least partially within the perimeter of the crack-arresting structure, and a conductive element extending through an opening in the crack-arresting structure, wherein the conductive element is conductively coupled to the conductive structure.

15 Claims, 6 Drawing Sheets

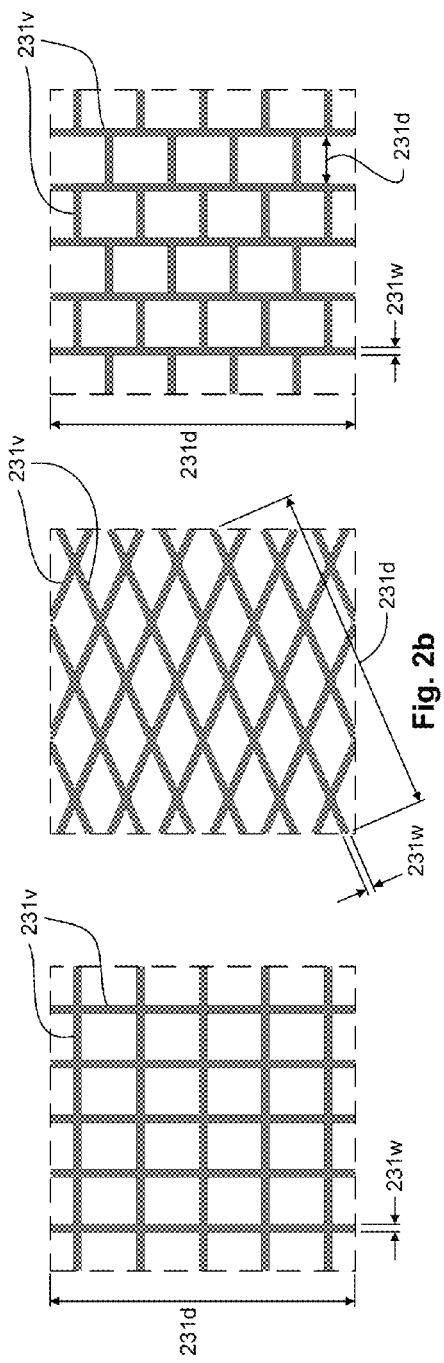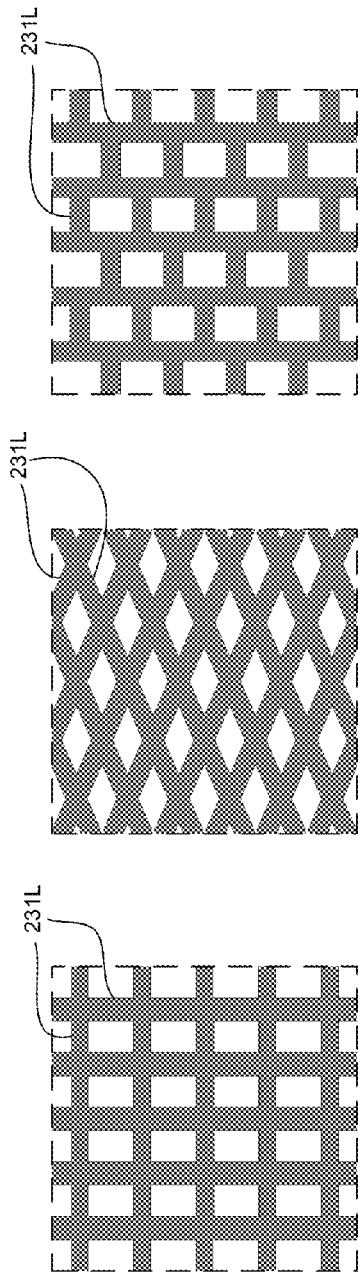
Fig. 2b
Fig. 2c

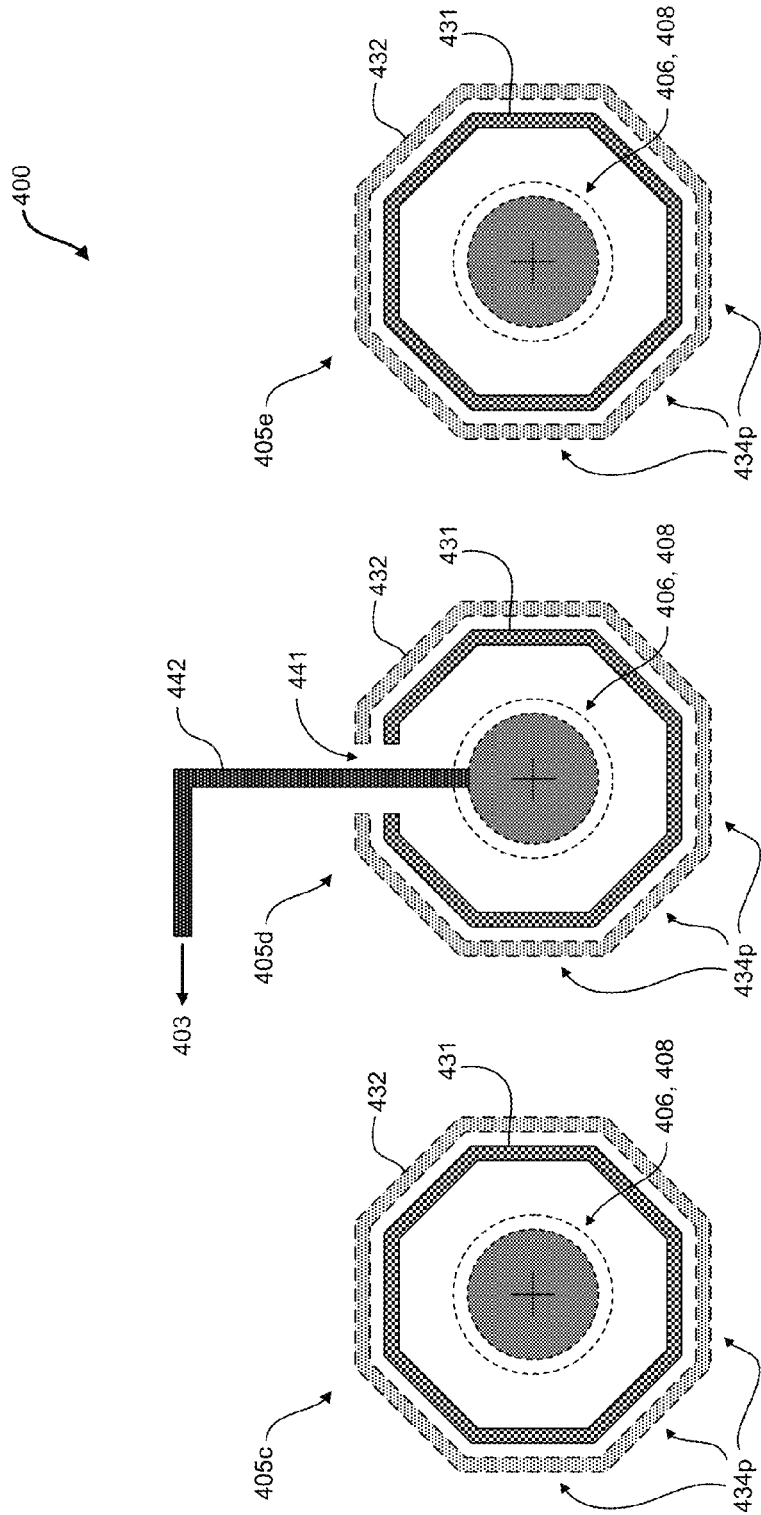

CRACK-ARRESTING STRUCTURE FOR THROUGH-SILICON VIAS

BACKGROUND

1. Field of the Disclosure

Generally, the present disclosure relates to sophisticated integrated circuits, and, more particularly, to crack-arresting structures for through-silicon vias (TSV's) and methods for forming the same.

2. Description of the Related Art

In recent years, the device features of modern, ultra-high density integrated circuits have been steadily decreasing in size in an effort to enhance the overall speed, performance, and functionality of the circuit. As a result, the semiconductor industry has experience tremendous growth due to the significant and ongoing improvements in integration density of a variety of electronic components, such as transistors, capacitors, diodes, and the like. These improvements have primarily come about due to a persistent and successful effort to reduce the critical dimension—i.e., minimum feature size—of components, directly resulting in the ability of process designers to integrate more and more components into a given area of a semiconductor chip.

Improvements in integrated circuit design have been essentially two-dimensional (2D)—that is, the improvements have been related primarily to the layout of the circuit on the surface of a semiconductor chip. However, as device features are being aggressively scaled, and more semiconductor components are being fit onto the surface of a single chip, the required number of electrical interconnects necessary for circuit functionality dramatically increases, resulting in an overall circuit layout that is increasingly becoming more complex and more densely packed. Furthermore, even though improvements in photolithography processes have yielded significant increases in the integration densities of 2D circuit designs, simple reduction in feature size is rapidly approaching the limit of what can presently be achieved in only two dimensions.

As the number of electronic devices on single chip rapidly increases, three-dimensional (3D) integrated circuit layouts, or stacked chip design, have been utilized for some semiconductor devices in an effort to overcome some of the feature size and density limitations associated with 2D layouts. Typically, in a 3D integrated circuit design, two or more semiconductor chips are bonded together, such as through a so-called controlled collapse chip connection (C4) process and the like, so as to form electrical connections between each chip. One method of facilitating the chip-to-chip electrical connections is by use of so-called through-silicon vias, or TSV's. A TSV is a vertical electrical connection element that passes completely through a wafer or semiconductor chip, allowing for more simplified interconnection of vertically aligned electronic devices, and thereby significantly reducing integrated circuit layout complexity, as well as the overall dimensions of a multi-chip circuit. Some of the benefits associated with the interconnect technology enabled by 3D integrated circuit designs include accelerated data exchange, reduced power consumption, and much higher input/output voltage densities.

One illustrative prior art configuration of a semiconductor chip 100 that includes a through-silicon via is schematically illustrated in FIG. 1. As shown in FIG. 1, the semiconductor chip 100 may comprise a substrate 101, which may represent any appropriate carrier material, such as silicon or silicon-based materials, and the like. Additionally, the semiconductor chip 100 may include a semiconductor layer 102 that may be made up of active areas (not shown) in which a plurality of schematically depicted active and/or passive circuit elements 103, such as transistors, capacitors, resistors and the like may be formed, in which case the semiconductor layer 102 may also be referred to as a device layer 102. Depending on the overall design strategy employed for the semiconductor chip 100, the substrate 101 may in some cases be a substantially crystalline substrate material (i.e., bulk silicon), whereas in other instances the 10substrate 101 may be formed on the basis of a silicon-on-insulator (SOI) architecture, in which a buried insulating layer (not shown) may be provided between the device layer 102 and the substrate 101. It should be appreciated that the semiconductor/device layer 102, even if comprising a substantially silicon-based material layer, may include other semiconducting materials, such as germanium, carbon and the like, in addition to appropriate dopant species for establishing the requisite active area conductivity type for the circuit elements 103.

The semiconductor chip 100 shown in FIG. 1 also illustrates a contact layer 104, which may be formed above the device layer 102. The contact layer 104 may be made up of a suitable dielectric material, such as silicon dioxide, silicon nitride, silicon oxynitride, and the like, and may include a plurality of contact vias 104v. Typically, the contact vias 104v provide conductive electrical connections between one or more of the various circuit elements 103 and a metallization system 105 formed above the contact layer 104. The metallization system 105 may be made up of several metallization layers, such as the metallization layers 105a-h, although it should be appreciated that either more or fewer metallization layers may also be used, depending on the overall device requirements.

Generally, each of the metallization layers 105a-h will be made up of a suitable dielectric insulating material and may have formed therein a plurality of conductive vias 105v and/or a plurality of conductive lines 105L, such as are schematically depicted in FIG. 1, and which, when electrically connected to the circuit elements 103 by way of the contact vias 104v, may thereby form the overall circuit layout (not shown) of the semiconductor chip 100. It should be appreciated, however, that, depending on various device parameters—such as the circuit design, materials of construction, overall processing strategy, and the like—some of the various metallization layers making up a given metallization system may include any one of several combinations of conductive lines 105L and conductive vias 105v. For example, a give metallization layer may include: a level of conductive vias 105v only; a level of conductive lines 105L only (see, e.g., metallization layer 105a in FIG. 1); a level of conductive lines 105L and a level of conductive vias 105v (see, e.g., metallization layers 105b-105h in FIG. 1); or multiple levels of conductive lines 105L and conductive vias 105v.

The size and spacing of the conductive lines 105L and/or conductive vias 105v used in a given metallization layer may depend on several factors, including, for example, device design process node size (e.g., 45 nm, 32 nm, 22 nm, etc.), as well as the type of dielectric material used for the metallization layer. For example, low-k dielectric materials—such as dielectric materials having a dielectric constant, or k-value, that is approximately 3.0 or lower—may be used when smaller critical dimensions (i.e., thinner or narrower) and a closer spacing (i.e., finer pitch) of the various conductive elements may be desired. On the other hand, more "traditional" silicon-based dielectric materials, such as silicon dioxide, silicon oxynitride, silicon nitride, silicon-carbon-nitride, and the like, which generally have dielectric constants in excess of approximately 3.5, may be used when size and spacing of the conductive lines 105L and/or conductive vias 105v may not be so critical. FIG. 1 schematically depicts an illustrative prior art configuration that includes both respective metallization layers 105a-f that are made up of low-k dielectrics and relatively smaller sized/finer pitched conductive elements 105L, 105v, as well as respective metallization layers 105g-h that are made up of, for example, a silicon dioxide based on TEOS (tetraethyl-orthosilicate) and relatively larger sized/coarser pitched conductive elements 105L, 105v.

The typical processing steps and materials used to form the circuit elements 103 in the device layer 102, the contact layer 104, and the metallization system 105 are well known in the art, and will not be further herein in detail.

As shown in FIG. 1 the illustrative semiconductor chip 100 may also include one or more through-silicon vias (TSV's) 106 for facilitating electrical connections between two or more stacked chips, as previously described. Typically, after chip processing has been completed, the TSV 106 is a continuous one-piece conductive plug that extends at least from the front side 100f of the substrate 101 to the back side 100b of the substrate 101. In some cases, the TSV 106 may also extend through the contact layer 104 so as to interface with the first metallization layer of the metallization system 105, such as the metallization layer 105a, as shown in FIG. 1. Depending on the various processing parameters associated with forming the TSV 106, such as the depth and width of the via opening (not shown), the material of the substrate 101, and the like, the sidewalls of the TSV 106 may be slightly tapered, as shown in FIG. 1, or they may be substantially vertical with respect to the front and back sides 100f, 100b. The TSV 106 may typically be made up of a suitable conductive material, such as copper or copper-based alloys, and may have an average width 106w ranging between approximately 1 µm and 10 µm. The TSV 106 may also have a through-substrate length 106L of approximately 40-60 µm, although in certain devices the length 106L may be less than 40 µm or greater than 60 µm, depending on the overall device design requirements.

A liner 107 may typically be positioned between the TSV 106 and the substrate 101 so as to electrically isolate the TSV 106, and in some cases, to substantially prevent the material of the TSV 106 from diffusing into the substrate 101, a situation which could create undesirable conducting paths in the semiconductor chip 100, and potentially lead to a commensurate degradation in overall device performance. The material of the liner 107 may have a sidewall thickness in the range of 200-400 nm, and may be made up any suitable insulating dielectric material, such as silicon dioxide, silicon nitride, silicon oxynitride, and the like. Additionally, in some cases a diffusion barrier layer (not shown) having a thickness in the range of 100-200 nm may be formed between the liner 107 and the TSV's 106 so as to prevent the material of the TSV's 106 from diffusing into and/or through the liner 107 and into the substrate 101, the device layer 102, and/or the contact layer 104.

As shown in FIG. 1, a conductive structure 108 may also be formed in the metallization system 105 above the TSV 106. Depending on the overall device requirements, a lower end 108e of the conductive structure 108 may be electrically connected to the upper end 106u of the TSV 106 at the front side 100f of the substrate 101, and may extend from the upper end 106u to the last metallization layer of the metallization system 105, such as the metallization layer 105h. Furthermore, the upper end 108u of the conductive structure 108 may also be electrically connected to a bump structure 112 through a contact pad 110, both of which may be electrically isolated by a passivation layer 111 formed above the last metallization layer 105h of the metallization system 105.

In some cases, the bump structures 112 may be designed to facilitate a bonded electrical connection to another chip or substrate during a chip packaging process, as previously discussed. However, it should also be appreciated that, in at least some devices, bump structures 112 and contact pads 110 may also be provided above the last metallization layer 105h that are electrically connected to one or more of the circuit elements 103 of the semiconductor chip 100, as shown in FIG. 1. In some cases, the bump structures 112 may be made up of an underbump metallization layer 112u and a solder ball 112b, however, it should be noted that other bump structure configurations may also be used, such as pillar bumps and the like. Furthermore, and depending on the overall layout considerations for the semiconductor chip 100, the bump structures 112 may be in direct contact with the contact pads 110, as shown in FIG. 1, whereas in some cases one or more of the bump structures 112 may be positioned a distance away from a respective contact pad 110 and conductively coupled to the pad 110 by a redistribution layer (not shown).

Typically, the conductive structure 108 is made up of a plurality of conductive lines 108L and/or a plurality of conductive vias 108v formed in each of the metallization layers 105a-f. The size, spacing, and design of each of the pluralities of conductive lines 108L and conductive vias 108v may be established in similar fashion as previously described with respect to the conductive lines 105L and conductive vias 105v, giving due consideration to the power transmission requirements between chips for the TSV 106 and conductive structure 108. Additionally, in certain cases, additional conductive elements (not shown) may be provided within one or more of the metallization layers 105a-h that conductively couple the conductive structure 108 to one or more of the conductive lines 105L and/or conductive vias 105v, thereby providing power to at least some of the circuit elements 103.

During normal operation, the temperature of the semiconductor chip 100 will generally increase, due to, for example, the relatively large power consumption by the chip 100. This increased temperature can potentially have an adverse impact on the performance of the circuit elements 103 making up the semiconductor chip 100, due at least in part to the relatively high magnitude of thermal stresses that may be induced in the device layer 102 and the contact layer 104—and consequently on the circuit elements 103—by the TSV 106. These high thermal stresses are generally due to the significant difference in the coefficient of thermal expansion (CTE) between copper—which may be a major material constituent in many TSV's—and that of several of the materials that are commonly used in semiconductor device processing, such as silicon, germanium, silicon dioxide, silicon nitride and the like. For example, Table 1 below lists some approximate representative values of the bulk linear coefficient of thermal expansion (CTE) of several materials that may commonly be used in the manufacture of semiconductor devices, graphically illustrating the difference between the CTE of conductive materials that might commonly be used for forming TSV's, and that of the semiconductor-based materials which might comprise the majority of many device layers and circuit elements making up a typical semiconductor chip, such as the semiconductor chip 100.

TABLE 1

Approximate Bulk Linear Coefficients of
Thermal Expansion for Selected Materials

| Conductive Material | CTE (µm/m/° C.) | Semiconductor-Based Material | CTE (µm/m/° C.) |
|---|---|---|---|
| Tungsten | 4.3 | Silicon | 2.6 |
| Tantalum | 6.5 | Germanium | 5.8 |
| Titanium | 8.6 | Silicon-Germanium | 3.4-5.0 |
| Nickel | 13.0 | Silicon Dioxide | 0.5 |
| Copper | 16.6 | Silicon Nitride | 3.3 |
| Aluminum | 22.2 | Silicon Carbide | 4.0 |

As can be seen from the approximate CTE data presented in Table 1 above, the coefficient of expansion of a typical conductive material such as copper ranges anywhere from approximately 3 to 30 times greater than the CTE of typical semiconductor-based materials, and in particular is approximately 6 time greater than the CTE of silicon, which may make up the bulk of the substrate 101 of the semiconductor chip 100. Moreover, due to the large amounts of power that are typically transmitted through TSV's—and the correspondingly higher temperatures that may generated as a result—these differences in thermal expansion coefficients may be even further magnified.

During normal device operation, the TSV 106 will typically undergo thermal expansion that is generally oriented in two different directions: a radial expansion 106r across the width 106w of the TSV 106, and an axial expansion 106a over the length 106L. The effects of both the radial expansion 106r and the axial expansion 106a are further discussed below.

In general, the radial expansion 106r will be resisted by the materials of the surrounding substrate 101, device layer 102, and contact layer 104, which, due to the drastic difference in thermal expansion coefficients noted in Table 1 above, will not expand as much as the TSV 106. This radial expansion 106r, resisted by the surrounding materials, often results in correspondingly high thermal stresses 120 in the areas surrounding the TSV 106. As those familiar with the design of sophisticated integrated circuit devices well understand, changes in the stress field surrounding some semiconductor devices, such as field effect transistors and the like, can at least incrementally affect the mobility of holes and/or electrons in the channel region of a device, thus impacting overall performance. Additionally, due to the tremendous size disparity between that of a typical TSV (e.g., sizes on the order of µm's) vs. that of a typical modern integrated circuit element (e.g., sizes on the order of nm's)—a disparity that may approach three orders of magnitude—the thermal stresses 120 induced in any circuit elements 103 that are positioned proximate the TSV's may be even further magnified.

One prior art approach of addressing the local stress effects that may result from the radial expansion 106r of the TSV 106 is to place a "cushion" or "buffer" layer between the TSV 106 and the materials of the surrounding substrate 101, device layer 102, and/or contact layer 104. In some cases, the material of the "buffer" layer may selected so as to have a certain degree of elasticity that may be sufficient to absorb at least some of the differential thermal expansion between the TSV 106 and the surround materials. In some cases, the "buffer" layer may also serve a dual purpose of an insulating layer, and therefore may be used in lieu of the liner 107, provided the material of the "buffer" layer, such as an organic polymer material and the like, provides the requisite electrical isolation function.

For the most part, the prior art "buffer" layer approach is primarily directed to relieving the thermal stress effects that the radial expansion 106r may have on surrounding materials. It does little, however, to address the effects that the axial expansion 106a of the TSV 106 may have on the metallization layers 105a-h of the metallization system 105 formed above the substrate 101. Under the axial expansion 106a, the TSV 106 may induce an uplift load 121 on the first metallization layer 105a, and that uplift load 121 may be transmitted through at least some of the succeeding metallization layers formed thereabove. In some cases, the uplift load 121 caused by the axial expansion 106a may be sufficiently high enough to cause mechanical damage in one or more the metallization layers 105a-h, which may manifest as a crack 130, or a crack-like defect, such as a material layer delamination, and the like. Moreover, the possible creation of these thermally-induced cracks 130 or delamination defects may be compounded in those metallization layers of the metallization system 105 that are made up of low-k dielectric materials (which typically have a lower mechanical strength, and therefore a commensurately lower overall resistance to loads and stresses), thereby possibly resulting in further reduced product performance and/or product life. Not only might these cracks 130 and/or delamination defects generally weaken the areas surround the TSV 106 and the conductive structure 108, they may also tend to propagate and extend throughout the various metallization layers 105a-h of the metallization system 105. Furthermore, such propagating cracks 130 and/or delaminations may affect, and possibly damage, at least some of the conductive lines 105L and/or conductive vias 105v formed in the various metallizations layers 105a-h that define the overall circuit (not shown) of the semiconductor chip 100, thus potentially decreasing the overall chip reliability and/or performance.

Accordingly, there is a need to implement new design strategies to address at least some of the operation and performance issues associated with devices that utilize through-silicon vias for transmitting power between chips. The present disclosure relates to methods and structures for avoiding, or at least reducing, the effects of one or more of the problems identified above.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the subject matter disclosed herein relates to structures formed on semiconductor chips that are used for at least partially addressing the thermally induced stresses and metallization system cracking problems in a semiconductor chip that may be caused by the presence of through-silicon vias (TSV's), and which may be due primarily to the significant differences in thermal expansion between the materials of the TSV's and the semiconductor-based materials that generally make up the remainder of the semiconductor chip. One illustrative device disclosed herein includes a substrate and a crack-arresting structure positioned above the substrate, the crack-arresting structure comprising a plurality of crack-arresting elements and having a perimeter when viewed from above. The disclosed device also includes, among other things, a conductive structure positioned at least partially within the perimeter of the crack-arresting structure, and a conductive element extending through an opening in the crack-arresting structure, wherein the conductive element is conductively coupled to the conductive structure.

Another illustrative embodiment disclosed herein is a semiconductor chip that includes a metallization system positioned above a substrate of the semiconductor chip, wherein the metallization system is made up of, among other things, a plurality of metallization layers and a conductive structure positioned in at least one of the plurality of metallization layers. The illustrative semiconductor chip further includes a crack-arresting structure that is also positioned above the substrate, wherein the crack-arresting structure at least partially surrounds the conductive structure and comprises a plurality of crack-arresting elements. Additionally, the disclosed semiconductor chip includes a conductive element that is positioned in at least one of the metallization layers and that is conductively coupled to the conductive structure, wherein the conductive element extends through an opening in the crack-arresting structure.

An additional illustrative semiconductor chip is also disclosed that includes, among other things, a conductive via element positioned in a semiconductor substrate of the semiconductor chip, the conductive via element providing an electrical connection between a front side of the semiconductor substrate and a back side of the semiconductor substrate, and a metallization system positioned above the front side of the semiconductor substrate, the metallization system having a plurality of metallization layers. The semiconductor chip further includes a conductive structure positioned in the metallization system and above the conductive via element, the conductive structure providing an electrical connection between the conductive via element and at least one of the plurality of metallization layers, as well as a crack-arresting structure positioned in the metallization system, the crack-arresting structure substantially surrounding the conductive structure. Moreover, the illustrative semiconductor chip also includes, among other things, a conductive line positioned in at least one of the plurality of metallization layers, the conductive line electrically coupling the conductive structure to at least one semiconductor device of the semiconductor chip.

BRIEF DESCRIPTION OF THE DRAWINGS

The disclosure may be understood by reference to the following description taken in conjunction with the accompanying drawings, in which like reference numerals identify like elements, and in which:

FIGS. 2a-2c schematically illustrate one illustrative embodiment of a through-silicon via crack-arresting structure in accordance with the present disclosure;

FIGS. 4a-4c schematically illustrate yet another illustrative embodiment of a through-silicon via crack-arresting structure in accordance with the present disclosure.

Figure 1:
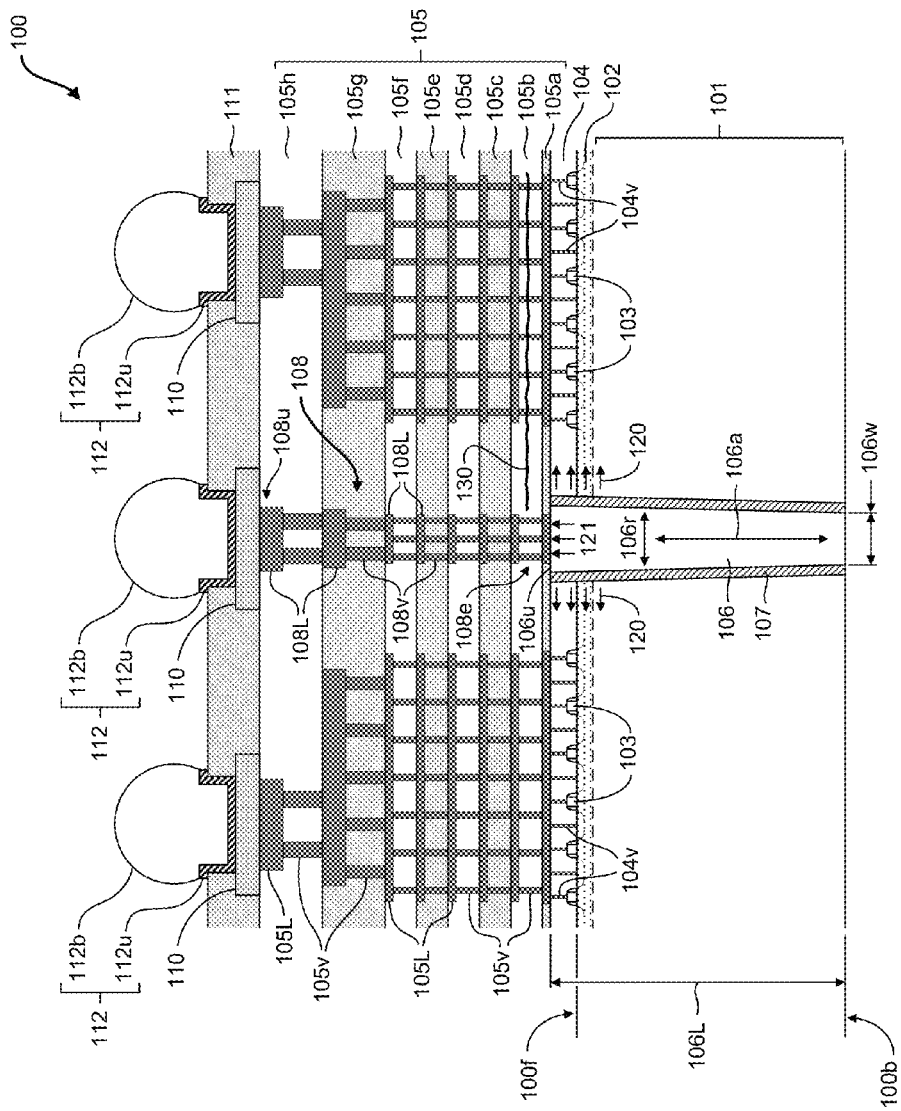
FIG. 1 schematically illustrates one prior art semiconductor chip having a through-silicon via formed through a substrate and a metallization system formed above the substrate.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides various through-silicon via (TSV) crack-arresting structures that may be used to mitigate at least some of the detrimental effects associated with the differential thermal expansion between a TSV and the surrounding materials of a semiconductor chip. Some of these detrimental effects include, but are not necessarily limited to, thermal stresses that may be induced on the various semiconductor circuit elements that are present in the device and/or contact layers of a chip in the areas surrounding a TSV, and which may generally be caused by a substantially high degree of differential radial thermal expansion of the TSV, relative to the materials of the surrounding substrate and contact layers. Furthermore, since a TSV generally extends completely though the substrate of a typical semiconductor chip, the differential axial expansion of the TSV may be even more problematic. For example, it should be appreciated that, based on the dimensions of a typical TSV, the total amount unrestricted thermal growth of a TSV in its axial direction (i.e., through the thickness of the substrate and along the length the TSV) may be approximately 10 times greater than a total unrestricted thermal growth of the TSV in its radial direction (i.e., across the width of the TSV), or even greater, depending on the specific length-to-width ratio of the TSV. Accordingly, and while the thermal stresses caused by the radial expansion of a TSV may affect to one degree or another the performance of some semiconductor circuit elements in the vicinity of the TSV, the proportionately greater amount of axial TSV expansion may lead to substantially more significant structural problems in the metallization layers above the TSV, such as cracks and the like, which could ultimately lead to device failure.

In certain illustrative embodiments of the present disclosure, the TSV crack-arresting structures described herein may be designed so as to reduce the effects of the previously described thermally-induced stresses on the performance of at least some of the semiconductor circuit elements surrounding the TSV. In some embodiments a flexible structure may be provided between the TSV and the semiconductor circuit elements, which may be configured to resist and/or absorb at least some of the thermal stresses, thereby at least partially shielding the circuit elements. Additionally, in the event that cracks are created in one or more of the metallization layers formed above the substrate due to the axial thermal expansion of the TSV, the crack-arresting structure may also act to stop the crack from propagating into and damaging the stack of conductive lines and conductive vias that form the overall semiconductor chip circuit layout, or at least reduce the rate at which the crack may propagate.

It should be noted that, where appropriate, the reference numbers used in describing the various elements shown in the illustrative embodiments of FIGS. 2a-2d, FIGS. 3a-3c, and FIGS. 4a-4c substantially correspond, where appropriate to the reference numbers used in describing related elements illustrated in FIG. 1 above, except that the leading numeral in each figure has been changed from a "1" to a "2," a "3," or a "4," as applicable. For example, the semiconductor chip "100" corresponds to the semiconductor chips "200" and "300," the substrate "101" corresponds to the substrate "201" and the substrate "301," the metallization layer "105c" corresponds to the metallization layers "205c," "305c," and "405c," and so on. Accordingly, the reference number designations used to identify some elements of the presently disclosed subject matter may be illustrated in the FIGS. 2a-2d, FIGS. 3a-3c and FIGS. 4a-4c but may not be specifically described in the following disclosure. In those instances, it should be understood that the numbered elements shown in FIGS. 2a-2d, FIGS. 3a-3c and FIGS. 4a-4c which are not described in detail below substantially correspond with their like-numbered counterparts illustrated in FIG. 1 and described in the associated disclosure set forth above.

Furthermore, it should be understood that, unless otherwise specifically indicated, any relative positional or directional terms that may be used in the descriptions below—such as "upper," "lower," "above," "below," "over," "under," "top," "bottom," "vertical," "horizontal," and the like—should be construed in light of that term's normal and everyday meaning relative to the depiction of the components or elements in the referenced figures. For example, referring to the schematic cross-section of the semiconductor device depicted in FIG. 2a, it should be understood that the back side 200b of the substrate 201 is positioned at or near the "bottom" or "lower" surface of the substrate 201, and the front side 200f is positioned at or near the "top" or "upper" surface. Similarly, it should also be understood that the substrate 201 is positioned "below" or "under" the device layer 202, and the metallization system 205 is positioned "above" or "over" the contact layer 204. Additionally, the term "vertical" should be understood as being substantially perpendicular to the front and/or back faces 200f, 200b of the substrate 201, whereas the term "horizontal" should understood as being substantially parallel to the front and/or back faces 200f, 200b.

FIGS. 2a-2d, which schematically depict one illustrative embodiment of a TSV crack-arresting structure in accordance with the present disclosure, are described in detail below.

Figure 2A:
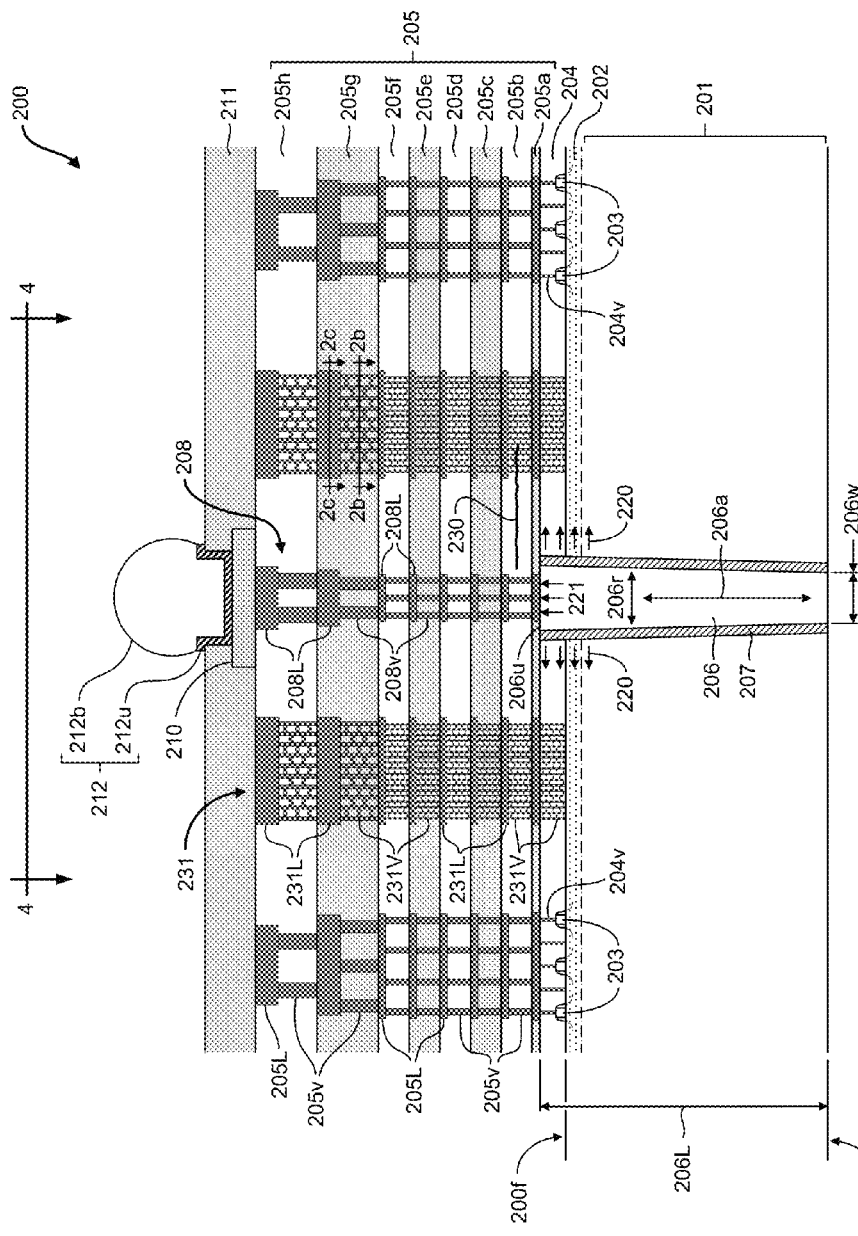

FIG. 2a shows a schematic cross-sectional view of an illustrative semiconductor chip 200 similar in some aspects to the semiconductor chip 100 illustrated in FIG. 1 and described above. As with the semiconductor chip 100, and depending on the overall device requirements, the semiconductor chip 200 may be made up of a substrate 201, a device layer 202 that may include a plurality of circuit elements 203, a contact structure layer 204, and a metallization system 205. Furthermore, the semiconductor chip 200 may also include a TSV 206, which may be electrically isolated and separated from the substrate 201 by a liner 207. Additionally, in some embodiments, a barrier diffusion layer (not shown) may be formed between the TSV 206 and the liner 207. As shown in, the TSV's 206 may extend completely through the substrate 201—i.e., from the front side 200f to the back side 200b, and may also, in some embodiments, further extend through the contact layer 204 formed above the substrate 201 and device layer 202.

Additionally, the semiconductor chip 200 may be made up of a plurality of conductive vias 205v and conductive lines 205L forming the various portions of circuit layout (not shown) of the chip 200 in the various metallization layers 205a-g, as previously described. Furthermore, the semiconductor chip 200 may also include a conductive structure 208, which, in certain embodiments may be in conductive contact with a contact pad 210, and which may also be adapted to provide an electrical connection between a bump structure 212 and the TSV 206, as previously described.

It should be noted that, depending on the overall device requirements, the materials making up each of the above-listed elements of the semiconductor chip 200 shown in FIG. 2a may substantially correspond to the materials previously noted with respect to the semiconductor chip 100, and therefore will not described here in any further detail.

In some illustrative embodiments, the semiconductor chip 200 may also include a crack-arresting structure 231. As shown in FIG. 2a, the crack-arresting structure 231 may be positioned between the TSV 206 and conductive structure 208 on the one hand, and the circuit elements 203 and the associated stack of conductive lines 205L and conductive vias 205v on the other hand. Additionally, in certain embodiments the crack-arresting structure 231 may completely surround the TSV 206/conductive structure 208, as will be further described with respect to FIGS. 4a-c below. Furthermore, the crack-arresting structure 231 may also extend from the front side 200f of the substrate 201, through the contact layer 204 and the metallization layers 205a-g, and up to the interface between the last metallization layer 205h and the passivation layer 211. It should be appreciated, however, that the crack-arresting structure 231 may not in every instance need to extend through all of the metallization layers 205a-h, depending on the overall device design and circuit layout requirements.

Depending on the overall design and layout of the semiconductor chip 200, the crack-arresting structure 231 may be comprised of a plurality of conductive lines 231L and a plurality of via bars 231V, some or both of which may be formed in the contact layer 204 and each of the metallization layers 205a-h, as shown in FIG. 2a. It should be understood that the term "via bar" as used herein is generally intended to distinguish a difference between the conductive structures 231V of the crack-arresting structure 231 and the "vias" that may typically be used to create a conductive connection between the metal lines of one metallization layer and another, such as, for example, the conductive vias 205v. For purposes of the present disclosure, a "via" may typically be understood to be a structure that can be described as a vertical plug, post, or rod-like structure having a length and a width when viewed from above (i.e., in a horizontal plane) that are similar to one another. Furthermore, also when viewed from above, a "via" may often have a closed cross-sectional shape that may substantially be that of a circle or a recognizable polygon, such as a square, a hexagon, or an octagon, and the like. On the other hand, a "via bar," as that term is used herein, is intended to describe a structure that may have a width (see, e.g., the via bar width 231w as shown in FIG. 2b) in one direction when viewed from above that is substantially similar to that of a "via," but which may have a length (see, e.g., the via bar lengths and/or partial lengths 231d as shown in FIG. 2b) in another direction that may be significantly longer than the width. In some illustrative embodiments, the via bars 231V may have, for example, a length-to-width ratio of 100 or greater. Accordingly, in certain embodiments, a "via bar" may be considered to have a substantially continuous length 231d (see, e.g., FIG. 2b), relative to its width 231w (see, e.g., FIG. 2b). A "via bar," such as the via bars 231V, may therefore be likened to a "wall," whereas a "via," such as the vias 205v, may be likened to a "column" or "post."

In certain illustrative embodiments, the conductive via bars 231V and conductive lines 231L may arranged in a substantially mesh-like pattern (as will be described in further details with respect to FIGS. 2b-2d below) so as to provide an enhanced degree of strength and flexibility to the contact layer 204 and/or the metallization layers 205a-h. When exposed to the relatively high level of thermal stresses 220 that may be created in the device layer 202 and contact layer 204 as a result of the radial and or axial thermal expansion 206r, 206a of the TSV 206 as previously described, the enhanced flexibility of the mesh-like pattern of the conductive via bars 213V and/or conductive lines 231L of the crack-arresting structure 231 may serve to reduce the overall impact on the circuit elements 203 and the metallization system 205. Furthermore, in some embodiments of the crack-arresting structure 231, the mesh-like pattern of the elements used to form the structure 231 may also serve to "arrest," or stop, the propagation of at least some cracks 230 that may be created by the uplift load 221 of the TSV 206 due to the axial expansion 206a, as illustrated in FIG. 2a.

FIGS. 2b-2c schematically depict cross-sectional views of some illustrative embodiments of a mesh-like pattern that may be used to form the pluralities of conductive via bars 231V and conductive lines 231L of the crack-arresting structure 231. FIG. 2b is a cross-sectional view "2b-2b" drawn through the conductive via bars 231V of the crack-arresting structure 231 depicted on the right-hand side of FIG. 2a. As shown in FIG. 2b, in certain embodiments, the conductive via bars 231V in the contact layer 204 and/or in one or more of the metallization layers 205a-h may be arranged in a substantially interlocking mesh-like pattern or configuration, such as a square and/or rectangular grid pattern, a diamond-shaped pattern, or a stretcher bond (i.e., an offset rectangular) pattern of conductive structural elements. Furthermore, the conductive lines 231L may also be in similar types of patterns, as illustrated in FIG. 2c, which is the cross-sectional view "2c-2c" drawn through the conductive lines 231L of the crack-arresting structure 231 shown on the right-hand side of FIG. 2a. Moreover, and as noted previously, the strength and flexibility of the mesh-like pattern may serve both to reduce thermal stresses, such as the thermal stress 220 (see, FIG. 2a), as well as to arrest the propagation of thermally-induced cracks or delaminations 230 (see, FIG. 2a). It should be appreciated that other configurations may also be used, depending on the overall design and layout of the semiconductor chip 200, as well as the anticipated operating characteristics.

The various levels of conductive via bars 231V and conductive lines 231L that make up the crack-arresting structure 231 may be formed using patterning and material deposition processing techniques that are well known in the art. Furthermore, these elements may be readily incorporated into the same integration schemes as may be used to form the various stacks of conductive vias 205v and conductive lines 205L of the semiconductor chip 200. For example, in those illustrative embodiments where the conductive vias 205v and conductive lines 205L are made up of copper and/or copper based metal alloys, the same damascene and dual-damascene processing techniques may also be used to form the pluralities of conductive via bars 231V and conductive lines 231L of the crack-arresting structure 231.

Figure 3A:
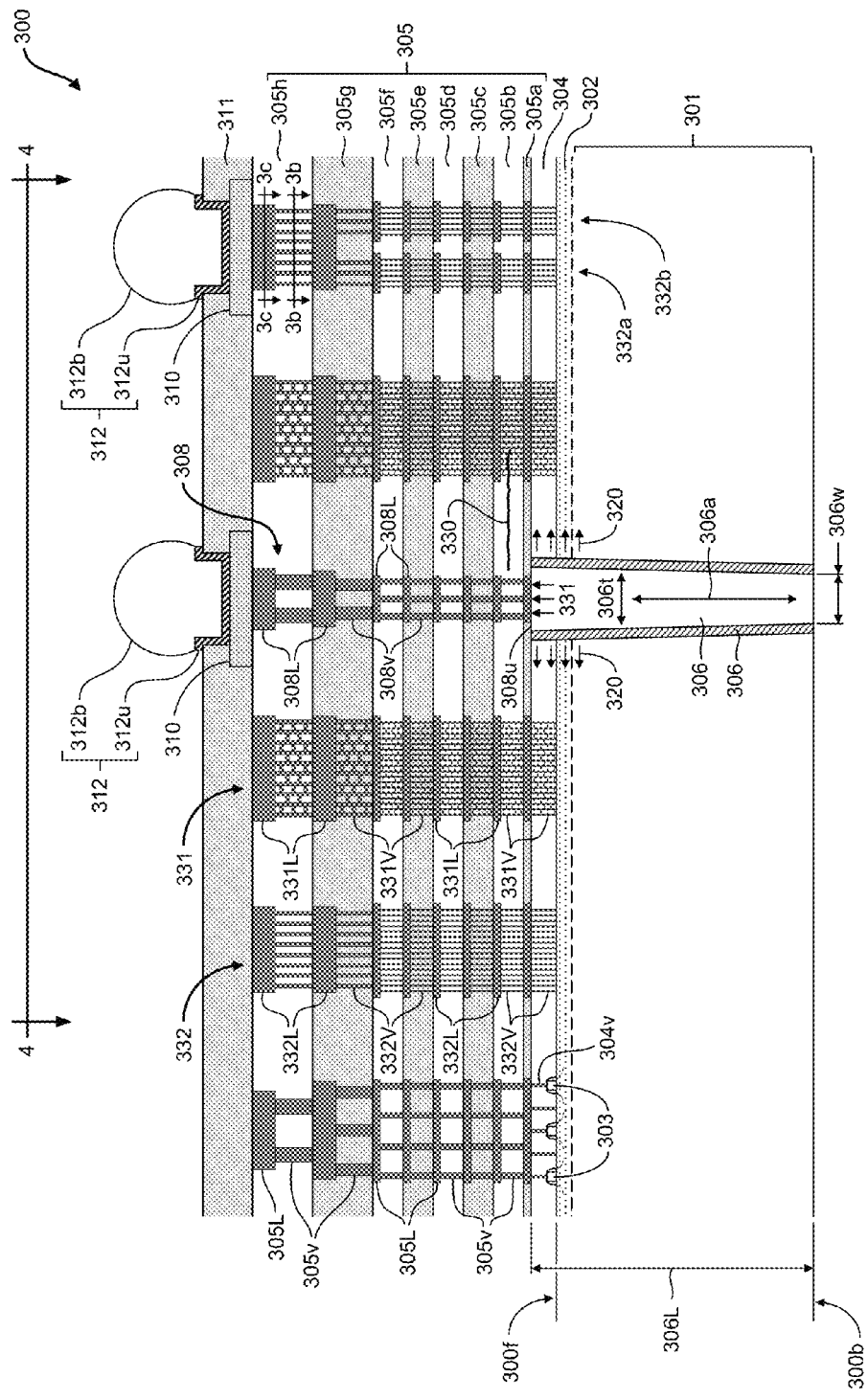
FIGS. 3a-3c schematically illustrate another illustrative embodiment of a through-silicon via crack-arresting structure disclosed herein.
Figure 3B:
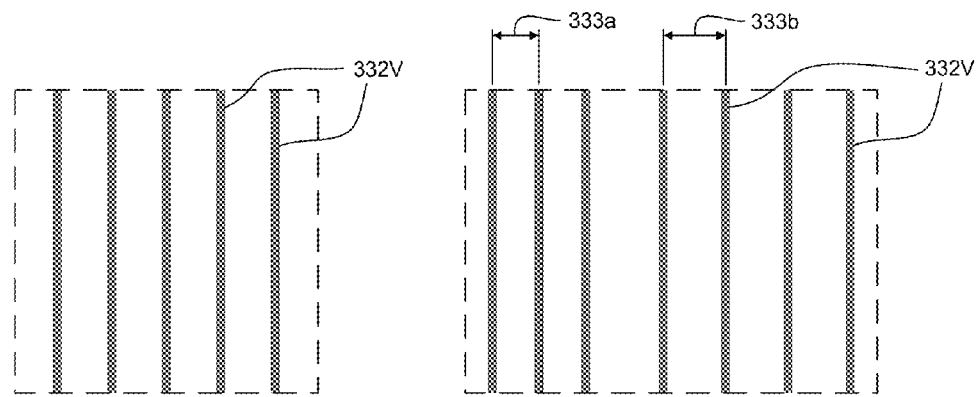
Figure 3C:
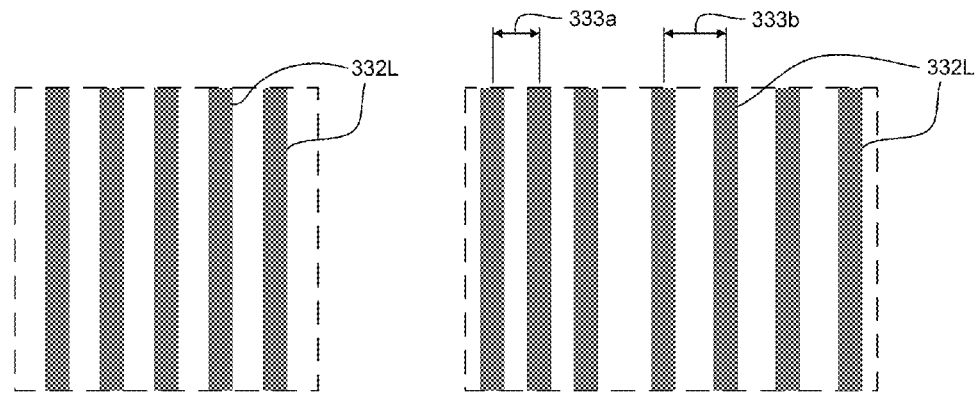

FIGS. 3a-3c schematically illustrate another embodiment of a TSV crack-arresting structure in accordance with the present disclosure. FIG. 3a depicts a schematic cross-sectional view of an illustrative semiconductor chip 300 that is similar in many respects to the semiconductor chip 200 illustrated in FIG. 2a and described above. As with the semiconductor chip 200, the semiconductor chip 300 may include a conductive structure 308 that provides an electrical connection between a TSV 306 and a bump structure 312. Moreover, in some embodiments, the semiconductor chip 300 includes a first crack-arresting structure 331, details of which have previously been described with respect to the crack-arresting structure 231 of FIGS. 2a-2d. However, in addition to the first crack-arresting structure 331, the semiconductor chip 300 may also include a second crack-arresting structure 332 that is positioned between the first crack-arresting structure 331 on the one hand, and the circuit elements 303 and the associated stack of conductive lines 305L and conductive vias 305v on the other hand. Furthermore, as with the first crack-arresting structure 331, the second crack-arresting structure 332 may, in certain embodiments, completely surround the conductive structure 308, as well as first the crack-arresting structure 331, as will be further described with respect to FIGS. 4a-c below. In at least some embodiment, the second crack-arresting structure 332 may extend from the front side 300f of the substrate 301, through the contact layer 304 and the metallization layers 305a-g, and up to the interface between the last metallization layer 305h and the passivation layer 311.

In certain embodiments, the second crack-arresting structure 332 may be comprised of a plurality of conductive lines 332L and a plurality of via bars 332V, some or both of which may be formed in the contact layer 304 and each of the metallization layers 305a-h, as shown in FIG. 3a. As with the first crack-arresting structure 331, the conductive via bars 332V and conductive lines 332L of the second crack-arresting structure 332 may be arranged so as to provide an enhanced degree of strength and flexibility to the contact layer 304 and/or the metallization layers 305a-h. Additionally, in at least some embodiments, the second crack-arresting structure 332 may also serve as a moisture oxidation barrier (MOB) that may be designed to reduce the potentially damaging effects of moisture ingress into the active area of the semiconductor chip 300 during subsequent chip packaging and assembly.

In some illustrative embodiments of the present disclosure, the second crack-arresting structure 332 may also contact a doped region (not shown) of the substrate 301 and device layer 302 so as to provide path to ground for the semiconductor chip 300 in the event of any surge currents and like, such as an electrostatic discharge. In such embodiments, the second crack-arresting structure 332 may provide a continuous electrical connection between the device layer 302 and a bump structure formed above the last metallization layer 305h of the metallization system 305, such as the bump structure 312 shown in FIG. 3a. Furthermore, in certain embodiments, at least some portions of the second crack-arresting structure 332 may comprise two or more separate stacks of conductive lines 332L and conductive via bars 332V, such as the stacks 332a, 332b shown for the crack-arresting structure 332 on the right-hand side in FIG. 3a.

As with the first crack-arresting structure 331, the conductive via bars 332V and conductive lines 332L of the second crack-arresting structure 332 may also be arranged in a substantially mesh-like pattern, as previously described above and illustrated in FIGS. 2b-2d. However, in other illustrative embodiments, the conductive via bars 332V and conductive lines 332L may be arranged in lines or strips, which, when viewed from above, may be substantially parallel, as shown in FIGS. 3b-3c. FIG. 3b, which depicts various embodiments of some illustrative arrangements of the conductive via bars 332V, is the cross-sectional view of section line "3b-3b" drawn through the second crack-arresting structure 332 depicted on the right-hand side of FIG. 3a. Similarly, FIG. 3c, which depicts embodiments of at least some illustrative arrangements of the conductive lines 332L, is the cross-sectional view "3c-3c" drawn through the second crack-arresting structure 332 shown on the right-hand side of FIG. 3a. Furthermore, depending on the design and/or the anticipated operating parameters of the semiconductor chip 300, the pitch or spacing 333a, 333b between adjacent conductive via bars 332V and conductive lines 332L may also vary, as shown in FIGS. 3b and 3c.

FIGS. 4a-4c schematically depict a further illustrative embodiment of the TSV crack-arresting structures disclosed herein. More specifically, FIGS. 4a-4c schematically illustrate the plan views "4-4" (see, FIGS. 2a and 3a) of three successive metallization layers 405c, 405d and 405e of an illustrative semiconductor chip 400, wherein additional metallization layers (e.g., layers 205f-h and 305f-h) and the passivation layer (e.g., 211 and 311) of the semiconductor chips 200 and 300, respectively, have been removed for clarity. As shown in FIGS. 4a-4c a first crack-arresting structure 431 substantially surrounds a TSV 406 and a conductive structure 408. Moreover, in some embodiments, a second crack-arresting structure 432 (optionally shown in FIGS. 4a-4c by dashed lines) may also substantially surround the first crack-arresting structure 431, the TSV 406, and the conductive structure 408. It should be appreciated that, for purposes of the present description, the illustrative first and second crack-arresting structures 431, 432, the TSV 406, and the conductive structure 408 are substantially similar in configuration to the corresponding elements illustrated in FIGS. 2a and 3a, and described above.

As shown in FIGS. 4a and 4c, the portions of the first and second crack-arresting structures 431, 432 in the metallization layers 405c and 405e define a substantially continuous perimeter 434p when viewed from above, i.e., in plan view. Accordingly, the pluralities of conductive via bars and conductive lines (see, e.g., the conductive via bars 331V, 332V and conductive lines 331L, 332L of FIG. 3a) that make up the crack-arresting structures 431, 432 can be considered to form a substantially continuous vertically-oriented "cage" that may enclose the conductive structure 408 and an uppermost portion of the TSV 406. As shown in the illustrative embodiment of FIG. 4a, the crack-arresting structures 431, 432 when viewed from above are formed to have a substantially octagonal shape. However, it should be appreciated that any substantially closed geometric shape may also be used, such as, for example, a circle, a square or rectangle, a hexagon, or any one of several other polygonal shapes, provided the final shape when viewed from above substantially surrounds the TSV 406 and conductive structure 408, so as to therefore be able to perform the crack-arresting and/or stress mitigating functions previously described.

FIG. 4b schematically illustrates a plan view of the portion of the crack-arresting structures 431, 432 in the metallization layer 405d. As with the plan views shown in FIGS. 4a and 4c, the perimeter 434p defined by the crack-arresting structure 431 (and the by the crack-arresting structure 432, when present) substantially surrounds the TSV 406 and the conductive structure 408, but is not fully continuous on all sides. Instead, and as shown in FIG. 4b, an opening 441 may be present in one location of the portion of the crack-arresting structure 431 (and in the crack-arresting structure 432, when present) formed in the metallization layer 405d through which a conductive element 442, such as a conductive line and the like, may pass. In certain embodiments, the conductive element 442 may be conductively coupled to the conductive structure 408, and may be adapted to provide an electrical connection from the TSV 406/conductive structure 408 to one or more of the circuit elements 403 making up the semiconductor chip 400, and which may be positioned outside of the perimeter 434p of the crack arresting structures 431, 432. In this way, the beneficial effects of the crack-arresting structures 431, 432 described above may be substantially maintained, while still enabling a high degree of flexibility when designing the overall circuit layout of the semiconductor chip 400.

For example, in some illustrative embodiments, a conductive element (such as the conductive element 442 shown in FIG. 4b) may be "routed out" from a TSV/conductive structure (such as the TSV 406/conductive structure 408) and through an opening (such as the opening 441) of the surrounding crack-arresting structure(s) (such as the crack-arresting structures 431, 432) in any one or more of the various metallization layers making up the metallization system of the semiconductor chip 400 (such as the metallization layer 405d). Furthermore, in certain embodiments, the crack arresting structures 431, 432 formed in the metallization layers 405c, 405e immediately adjacent to (i.e., above and below) the metallization layer 405d where the conductive element 442 is "routed out" from the TSV/conductive structure 406, 408 may be substantially "closed"—i.e., without an opening or a conductive element passing therethrough, such as the opening 441 and conductive element 442. In other illustrative embodiments, openings 441 and conductive elements 442 may be present in adjacent metallization layers, wherein the openings 441 may be oriented in substantially the same direction, or wherein the openings 441 may be oriented in substantially different directions. In yet further embodiments, a plurality of openings 441 and conductive elements 442 may also be present in the same metallization layer, such as the metallization layer 405d, whereas however each opening may be oriented in substantially different directions. It should also be appreciated that various other combinations regarding the proximity of metallization layers having openings, as well as the quantity of openings, may also be considered to be within scope of the above disclosure.

As a result, the subject matter disclosed herein provides various semiconductor structures that may be used to eliminate, or at least mitigate, some of the differential thermal expansion effects that may be associated with through-silicon vias that are sometimes used in stacked or 3D semiconductor chip packages. In some embodiments, a single crack-arresting structure may be used that substantially surrounds a conductive structure that is formed in a metallization system above a TSV, whereas in other embodiments, multiple crack-arresting structures may also be used. Additionally, the crack-arresting structures disclosed herein may be adapted so that electrical connections can be made to the TSV/conductive structure at any of the respective metallization layers making up the metallization system of the chip.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
   a substrate;
   a crack-arresting structure positioned above said substrate, said crack-arresting structure comprising a plurality of crack-arresting elements and having a perimeter when viewed from above, wherein said crack-arresting structure is positioned in a metallization system comprising a plurality of metallization layers, said metallization system being positioned above said substrate, and wherein said plurality of crack-arresting elements comprises a plurality of metal lines and a plurality of metal bars;
   a conductive structure positioned at least partially within said perimeter of said crack-arresting structure; and
   a conductive element extending through an opening in said crack-arresting structure, wherein said conductive element is conductively coupled to said conductive structure.

2. The device of claim 1, wherein said crack-arresting structure extends from said substrate to a last metallization layer of said plurality of metallization layers.

3. The device of claim 1, wherein said conductive element comprises a conductive line that is positioned in at least one of said plurality of metallization layers.

4. The device of claim 1, wherein at least one of said pluralities of metal lines and metal bars are arranged in a mesh pattern in at least one of said plurality of metallization layers.

5. The device of claim 4, wherein said mesh pattern comprises a plurality of intersecting metal structures.

6. The device of claim 1, wherein said conductive structure is positioned above and conductively coupled to a conductive via element positioned in said substrate, said conductive via element providing an electrical connection between a front side of said substrate and a back side of said substrate.

7. The device of claim 1, wherein said conductive element is electrically isolated from said crack-arresting structure.

8. The device of claim 1, wherein said conductive element is conductively coupled to at least one semiconductor device formed in and above said substrate and positioned outside of said perimeter of said crack-arresting structure.

9. A semiconductor chip, comprising:
   a conductive via element positioned in a semiconductor substrate of said semiconductor chip, said conductive via element providing an electrical connection between a front side of said semiconductor substrate and a back side of said semiconductor substrate;
   a metallization system positioned above said front side of said semiconductor substrate, said metallization system comprising a plurality of metallization layers;
   a conductive structure positioned in said metallization system and above said conductive via element, said conductive structure providing an electrical connection between said conductive via element and at least one of said plurality of metallization layers;
   a crack-arresting structure positioned in said metallization system, said crack-arresting structure substantially surrounding said conductive structure, wherein said crack-arresting structure extends from said substrate to a last metallization layer of said metallization system and wherein said crack-arresting structure comprises a plurality of metal lines and a plurality of metal bars positioned in a dielectric material of each of said plurality of metallization layers; and
   a conductive line positioned in said at least one of said plurality of metallization layers, said conductive line electrically coupling said conductive structure to at least one semiconductor device of said semiconductor chip.

10. The semiconductor chip of claim 9, wherein a configuration of said crack-arresting structure defines a perimeter when viewed from above, said conductive structure being positioned inside of said perimeter and said at least one semiconductor device being positioned outside of said perimeter.

11. The semiconductor chip of claim 9, wherein at least some of said plurality of metal lines are arranged in an intersecting mesh pattern.

12. The semiconductor chip of claim 9, wherein at least some of said plurality of metal bars comprise a plurality of spaced apart metal bars that are arranged in a substantially parallel configuration.

13. A device, comprising:
    a substrate;
    a crack-arresting structure positioned above said substrate, said crack-arresting structure comprising a plurality of crack-arresting elements and having a perimeter when viewed from above, wherein said crack-arresting structure is positioned in a metallization system comprising a plurality of metallization layers, said metallization system being positioned above said substrate, wherein said crack-arresting structure comprises an inner ring structure and an outer ring structure that is electrically isolated from said inner ring structure and wherein said outer ring structure comprises a plurality of spaced apart ring structures in at least one of said plurality of metallization layers;
    a conductive structure positioned at least partially within said perimeter of said crack-arresting structure; and
    a conductive element extending through an opening in said crack-arresting structure, wherein said conductive element is conductively coupled to said conductive structure.

14. The device of claim 13, wherein said inner ring structure is adapted to act as a crackstop and said outer ring structure is adapted to provide an electrical path to ground for said device.

15. The device of claim 13, wherein said inner ring structure is adapted to act as a crackstop and said outer ring structure is adapted to act as at least one of a crackstop and a moisture oxidation barrier.

* * * * *